United States Patent
Ingesson et al.

(10) Patent No.: US 6,750,656 B2
(45) Date of Patent: Jun. 15, 2004

(54) ESTIMATION OF CURRENT CONSUMPTION DUE TO RADIO ACTIVITIES IN GPRS

(75) Inventors: Kent-Inge Ingesson, Dalby (SE); Johan Hansson, Malmö (SE); Kristoffer Ptasinski, Lund (SE)

(73) Assignee: Telefonaktiebolaget LM Ericsson(PUBL), Stockholm (SE)

(*) Notice: Subject to any disclaimer, the term of this patent is extended or adjusted under 35 U.S.C. 154(b) by 0 days.

(21) Appl. No.: 10/241,063

(22) Filed: Sep. 10, 2002

(65) Prior Publication Data

US 2004/0046565 A1 Mar. 11, 2004

(51) Int. Cl.[7] ............... G01N 27/416; H04B 1/16; G01R 31/36
(52) U.S. Cl. .............. 324/427; 455/343.1; 377/20
(58) Field of Search ................ 324/427, 426, 324/428; 702/63; 455/566, 572, 574, 334, 343.1; 327/89; 377/13, 20, 37, 49

(56) References Cited

U.S. PATENT DOCUMENTS

| | | | |
|---|---|---|---|
| 5,434,508 A | 7/1995 | Ishida | 324/427 |
| 5,565,759 A | 10/1996 | Dunstan | 320/135 |
| 5,570,025 A | 10/1996 | Lauritsen et al. | 324/433 |
| 5,684,404 A * | 11/1997 | Millar | 324/427 |
| 5,714,870 A * | 2/1998 | Dunstan | 320/DIG. 21 |
| 5,784,295 A | 7/1998 | Hinohara | 702/63 |
| 5,936,534 A * | 8/1999 | Yokota | 324/433 |
| 6,138,002 A | 10/2000 | Alperovich et al. | 455/407 |

FOREIGN PATENT DOCUMENTS

| | | |
|---|---|---|
| JP | 06311558 | 11/1994 |

\* cited by examiner

Primary Examiner—Pia Tibbits
(74) Attorney, Agent, or Firm—Jenkens & Gilchrist, P.C.

(57) ABSTRACT

A technique for estimating current consumption of an electronic device such that current consumed during reception of bursts is utilized in calculating the remaining battery power. By determining the time duration of each reception burst and the charge consumed during each burst, the total charge consumed by the reception bursts is calculated. The total charge calculated is used to determine the remaining battery power.

15 Claims, 2 Drawing Sheets

ESTIMATION OF CURRENT CONSUMPTION DUE TO RADIO ACTIVITIES IN GPRS

TECHNICAL FIELD

The present invention relates to electronic devices, and more particularly, to an improved procedure for estimating the current consumption of a battery used in conjunction with the electronic device.

BACKGROUND OF THE INVENTION

Most portable electronic devices today utilize a rechargeable battery as a power source. As such, the display of the electronic device provides the user with a visual display of the residual power level of the rechargeable battery in order to avoid unexpected loss of power during use of the electronic device. By alerting the user of the residual power level, the user can initiate recharging of the device, terminate a call on a mobile station, or save data on a laptop computer prior to power loss.

The electronic devices, such as mobile stations, PDAs, or laptops, generally calculate a residual power level at a variety of time intervals. At power-up, most electronic devices calculate the residual power left in the battery. Then, at predetermined time intervals, or in response to certain actions, the electronic device recalculates the residual power level.

In U.S. Pat. No. 5,434,508, the residual battery power is calculated for a laptop computer having a normal operation mode and a suspended operation mode. The laptop computer includes a battery pack that comprises a calculator unit. The calculator unit determines an electric current flowing through a current detecting resistor. Following the determination of the electric current, current consumption data is read from a mode table. The mode table lists the possible modes and the current consumed for each particular mode. The residual battery power is then calculated by the calculator unit based on the information provided by the mode table.

In an alternative approach, in U.S. Pat. No. 5,784,295, the residual battery power is calculated for a mobile station capable of using a backlight. The mobile station consumes more battery power by operating with the backlight on, as opposed to with the backlight off. The residual power level is calculated by first determining the battery voltage when the backlight is on. Then the battery voltage is determined when the backlight is off. The residual power level is calculated by utilizing the difference of the determined battery voltages.

Algorithms for calculating the residual battery power take into account the operational mode of the electronic device, i.e. whether the device is in normal or idle mode for a mobile station, as well as whether the device is transmitting information. However, there is a need for even more accurate residual battery power estimation.

SUMMARY OF THE INVENTION

The present invention provides more accurate estimates of residual battery power by including power used during reception when calculating the residual power level. The method and apparatus of the present invention estimate the remaining battery power and estimate the charge consumed when receiving incoming bursts. The charge consumed when receiving incoming bursts is calculated by determining the time duration of the received burst and reading a value stored in memory related to the charge consumed by receiving the burst. Alternatively, each received burst may be counted by a counter. The estimated charge consumed when receiving bursts is calculated based on the values of the counters, or the calculated time duration, and the value stored in memory related to the charge consumed. The remaining battery power is determined by subtracting the estimated charge consumed from the previous remaining battery power estimate. If the electronic device has transmitted data, then the charge consumed by the transmissions is also subtracted from the previous remaining battery power estimate.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF PREFERRED EMBODIMENTS

Current residual battery power calculations do not take into account radio activity during the reception of bursts due to the fact that, historically, portable electronic devices have rather high power consumption when transmitting or performing other operations. When the battery power used during transmission is compared to the power used during reception in standby mode, the battery power used during reception is negligible. As such, conventional practice has not taken into account the charge consumed during reception when calculating the residual battery power. However, these currently used calculations now fall short of accurately determining the residual battery power.

As advancements have been made in electronic devices, the charge consumed during transmission or other operations has decreased. Accordingly, the charge consumed during standby mode has become significant. Moreover, with the introduction of GPRS, the radio activity associated with data reception has also become significant, especially because it will frequently occur during standby mode. As a consequence, it now becomes necessary to include the charge consumed during reception in residual battery power calculations.

Figure 1:
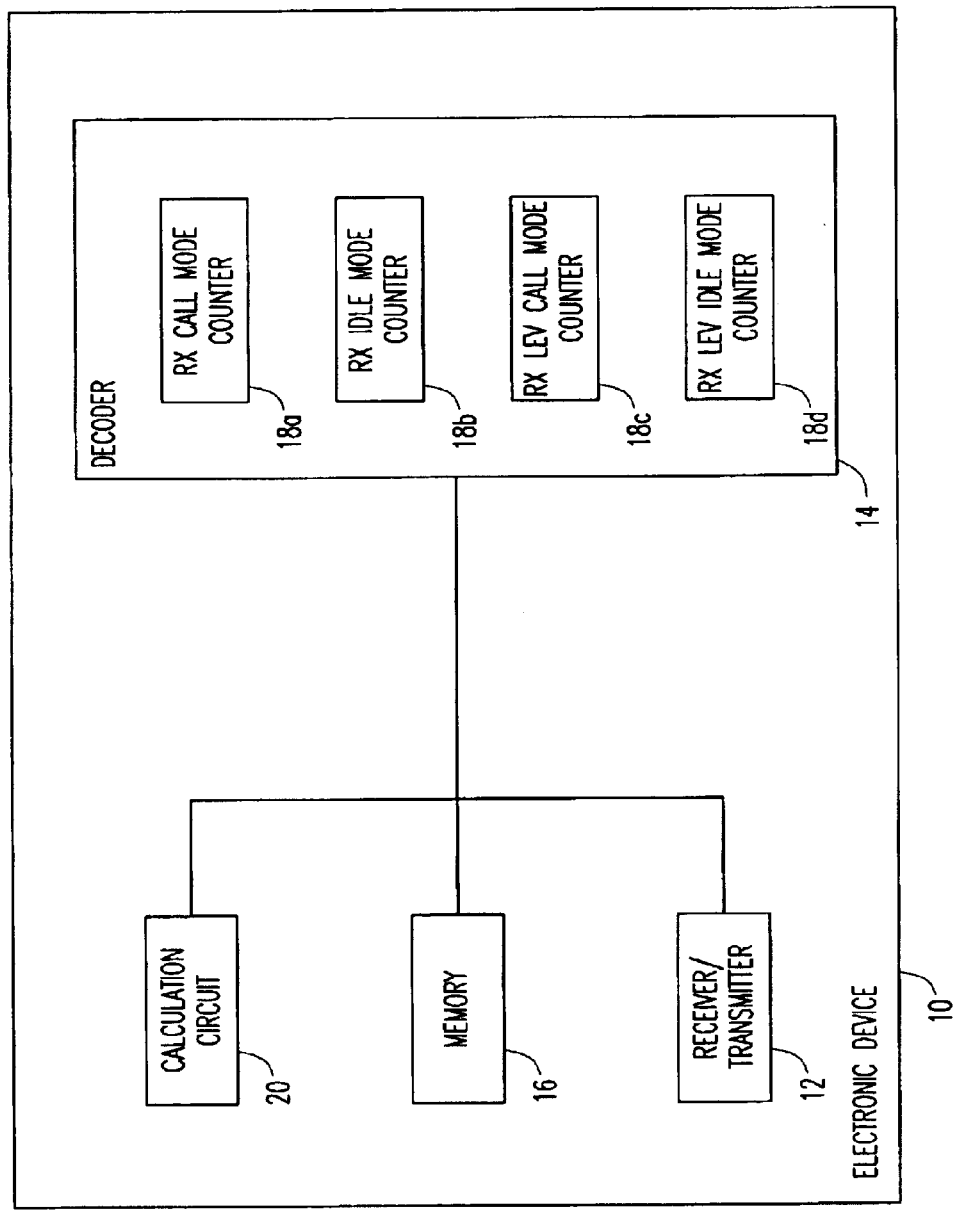
FIG. 1 is a block diagram of an electronic device for use in calculating residual battery power according to the present invention.

Referring now to the drawings, and more particularly to FIG. 1, a block diagram of an electronic device 10 including a calculating circuit 20 according to an embodiment of the present invention is shown. The electronic device 10 may comprise a mobile station, computer, PDA, pager or any other device operable to use a rechargeable battery. The electronic device 10 enables a more accurate estimate of residual battery power by including power used during reception in the calculations. The electronic device 10, such as a mobile station, receives information bursts at specific predefined intervals at a receiver 12. A decoder 14 decodes each burst after transmission in order to parse information included within the burst.

Many different types of bursts may be transmitted to the electronic device 10. In GSM, for example, there are four different RX burst types: Normal burst, frequency correction burst, synchronization burst, and RXLEV burst. The different types of bursts consume different amounts of power or battery capacity. For example, reception of a normal (RX) burst by the electronic device 10 and reception of a synchronization burst will consume different amounts of battery power. In addition, reception of a normal burst containing speech will generally consume more battery power than reception of a normal burst containing data because of the processing associated with speech decoding. An RXLEV burst, which is not an actual burst type but rather is an action performed to measure signal strength during a slot of a transmission frame received from a base station, also consumes a different amount of battery power than other bursts. The RXLEV burst may be used to aid in determining network conditions related to the electronic device 10.

The electronic device 10 typically receives information bursts, e.g. RX bursts, RXLEV bursts, etc., at particular well defined intervals. Once the received burst is decoded, the electronic device 10 is aware of which type of burst is received. To receive any bursts, normally the same units of the electronic device 10 must be operating. Therefore, the current consumption can be derived by knowing which units must be operating to receive the burst.

The current consumption ($I_{RX}$) will remain fairly constant during one RX burst. However the duration ($t_{RX}$) of an RX burst will vary depending on the type of burst received. In the preferred embodiment, the duration ($t_{RX}$ of each of the RX burst types is precalculated on a theoretical basis or measured by the hardware and/or software during the RX mode. The charge (Q) consumed by one RX burst can be denoted as:

$$Q = I_{RX} \cdot t_{RX} \quad (1)$$

where $I_{RX}$ represents a constant current consumption and $t_{RX}$ varies depending on the type of RX burst (e.g., the value of $t_{RX}$ will be different for an RXLEV burst than it is for a normal RX burst.)

In order to determine the charge for multiple bursts, the above equation is summed over a predetermined time interval (x). The charge (Q) consumed by the RX bursts received during the predetermined time interval (x) can be denoted as:

$$Q = \sum_{n=0}^{x} I_{RX} \cdot t_{RX_n} = I_{RX} \cdot \sum_{n=0}^{x} t_{RX_n} \quad (2)$$

due to the fact that $I_{RX}$ is considered constant. This equation facilitates the estimation of current consumption during reception and in GPRS mode, which is based on intensified RX activity.

In accordance with a preferred embodiment of the present invention, the charge Q consumed can be estimated by counting the number of a particular type of burst and multiplying the count value by a predetermined amount of charge associated with the particular type of burst. This predetermined charge amount can represent a relatively accurate estimate of the amount of charge or battery power consumed by each burst because the duration of each burst type is typically fairly constant and because the current consumption is also relatively constant, as mentioned above. This process of counting bursts and multiplying the count value by a predetermined charge amount can be repeated for one or more of the other burst types.

This process is implemented in the electronic device 10 by using counters 18 for each burst type and predetermined values corresponding to the battery power or charge consumed for each type of burst in call mode and in idle mode, which values are stored in a memory 16 of the electronic device 10. Different values can be stored for normal speech bursts and normal data bursts because of the different amounts of processing required. In an alternative embodiment, instead of storing different values for normal speech bursts and normal data bursts, a normal burst counter may be incremented multiple times for a speech burst compared to a lesser number of times for a data burst to account for the difference in charge consumed between the speech burst and the data burst. In yet another alternative, the difference in processing can be accounted for by calculating the current consumed by a DSP of the electronic device 10 during speech or data processing separately from the estimation of charge consumed during reception of the corresponding speech or data burst.

In a preferred embodiment, less than all of the possible predetermined values of bursts are stored in the memory 16. The normal bursts are the most common bursts received by the electronic device 10 and therefore charge values associated with the normal burst in call mode and the normal burst in idle mode are stored in the memory 16. In addition, the RXLEV bursts are also very common and charge values for the RXLEV burst received in call mode and the RXLEV burst received in idle mode are stored in the memory 16.

In the preferred embodiment, when bursts other than a normal or RXLEV burst are received, the charge value is normalized to one of the stored values. For instance, if a synchronization burst is received by the electronic device 10, although a charge value is not stored for the synchronization burst, a stored value such as the charge value for the RXLEV burst can be substituted for the synchronization charge value when battery power consumption estimates are made. As further discussed below, it is also possible to vary the number of times that the counter 18 is incremented based on the type of burst received (e.g., increment the counter once for a normal RX burst and five times for a frequency correction burst, where it is known that frequency correction bursts consume approximately five times the amount of current as a normal burst.) However, in an alternate embodiment, additional predetermined values may be stored in the memory 16 which correspond to charge values of the less common types of bursts, e.g., synchronization bursts, for call mode and for idle mode.

In the preferred embodiment, the predetermined values are read out of the memory 16 during a power-on sequence of the electronic device 10. The counters 18 are implemented at the decoder 14 of the electronic device 10. The counters 18 determine the number of bursts received for each mode and each type of burst. In one embodiment, separate counters 18 are implemented for each type of burst that has a predetermined value stored in the memory 16. For example, a normal burst counter 18a in call mode, a normal burst counter 18b in idle mode, an RXLEV burst counter 18c in call mode, and an RXLEV burst counter 18d in idle mode are implemented in one embodiment.

However, the counters 18 can be combined to determine the number of bursts for each mode using the same counter. For example, one counter 18 may be implemented to replace the normal burst counters 18a and 18b for call and idle modes. If one counter is implemented to count bursts for both modes, then the count is cleared at the initiation and termination of a call. The value of the counter before initiation of a call represents the number of bursts received in idle mode and the value of the counter at the termination of the call represents the number of bursts received while in call mode. When using separate counters, the values for idle and call mode are preserved separately thereby simplifying the calculation of remaining talk time and remaining standby time. However, when one counter 18 is implemented for each type of burst, the counter should be cleared upon initiating or terminating a call to simplify the separate estimations of remaining talk and standby time.

When less than all of the possible charge values are stored in the memory 16, the counters 18 can be implemented to estimate the charge consumption for the bursts not stored in the memory using the existing stored values. When a frequency correction burst is received, for example, one of the counters 18 (e.g., normal burst counter 18a) may be incremented two or more times to account for the additional power consumed by the reception of the frequency correction burst. In an alternative embodiment, as mentioned above, instead of using values from the counters 18 to calculate the total charge consumed during a period of time, the calculation circuit 20 can be used to measure the time duration of received bursts. The measured duration yields better accuracy than the implemented counters 18. However, by measuring the duration of the RX bursts, the processing load on the electronic device 10 is increased.

Figure 2:
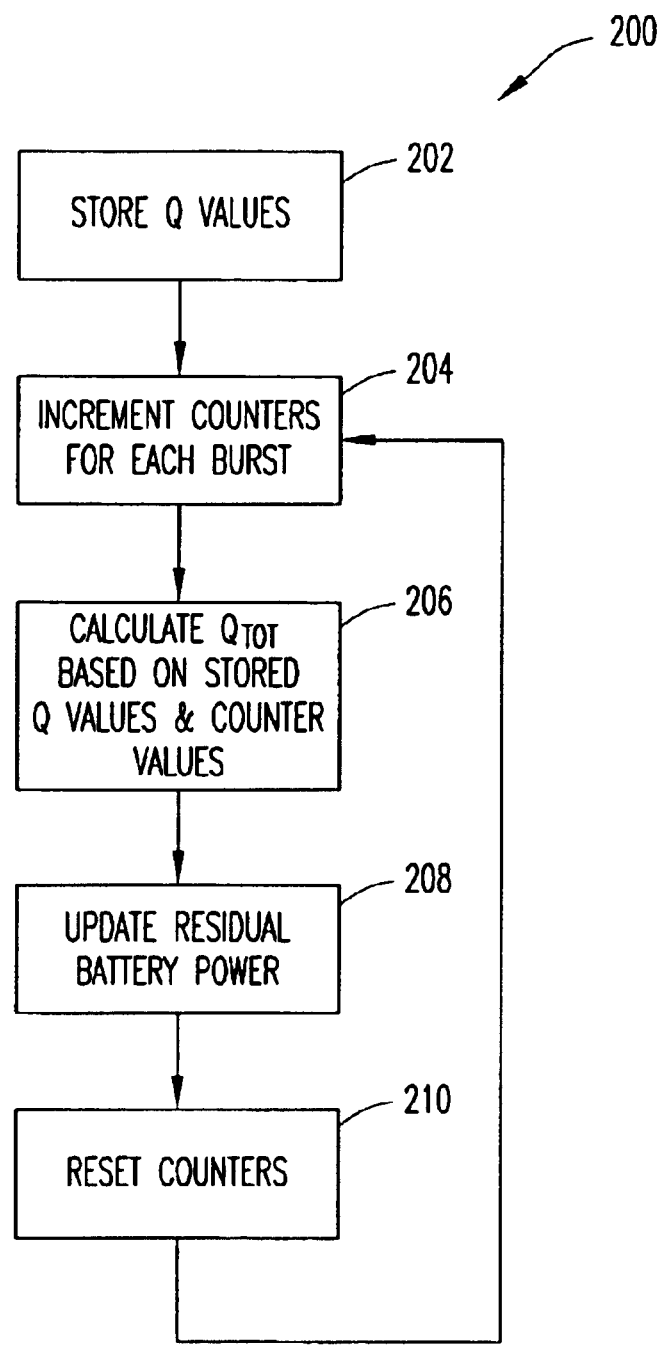
FIG. 2 is a flow diagram illustrating the calculation of residual battery power according to a method of the present invention.

Now with reference to FIG. 2, there is shown a flow diagram of a method 200 of calculating residual battery power in accordance with an embodiment of the present invention. First, at step 202, a plurality of Q values are stored in the memory 16. In one embodiment, these Q values represent a value for the charge consumed by a normal RX burst and a value for the charge consumed by an RXLEV burst. At step 204, a burst is received, and one of the counters 18 is incremented, depending on which type of burst is received. For example, if a normal burst is received, then the counter associated with normal bursts is incremented. If an RXLEV burst is received, then the counter associated with RXLEV bursts is incremented. At step 206, when an update for the remaining battery power is to be performed, then the values are read from the counters. The total consumed charge $Q_{Tot}$ is calculated as follows:

$$Q_{Tot} = \text{Counter}_{Normalburst} * Q_{Normalburst} + \text{Counter}_{RXLEVburst} * Q_{RXLEVburst}, \quad (3)$$

where $Q_{normalburst}$ is the charge consumed (as determined, e.g., from equation (1)) for normal bursts received by the electronic device 10 and $Q_{RXLEVburst}$ is the charge consumed (as determined, e.g., from equation (1)) for RXLEV bursts received by the electronic device 10. The $Q_{tot}$ calculation is preferably made separately for call mode and for idle mode. By performing the calculations separately, remaining talk time and remaining standby time can be independently calculated. Remaining talk time is typically updated throughout a call in progress, whereas remaining standby time is calculated upon termination of a call.

The residual battery power is determined based, at least in part, on the total charge consumed $(Q_{Tot})$ during the reception of incoming bursts. The total charge consumed $(Q_{Tot})$ is subtracted from the previously calculated remaining battery power. In addition, if any outgoing transmissions have taken place, then the charge consumed by those transmissions may also be used in calculating the remaining battery power. The residual battery power is updated at step 208 for use with future residual battery power estimates. At step 210, the counters are reset in order for a new count to begin. The new count is used at a later predetermined time interval to further update the residual battery power.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A method for estimating charge consumed when receiving bursts of data at an electronic device, said method comprising the steps of:

incrementing at least one counter each time a data burst is received;

reading at least one value from a memory, the at least one value representing an estimate of a charge consumed during reception of a burst;

reading a value from the at least one counter, the value representing a number of bursts received since a calculation of a previous battery power estimate;

multiplying the value read from the counter with the value read from the memory to produce an estimated charge consumption; and updating said previous battery power estimate using said estimated charge consumption to produce an updated battery power estimate.

2. A method for estimating remaining battery power of an electronic device, said method comprising the steps of:

estimating a total charge consumed when receiving bursts of data at the electronic device; and subtracting the estimated total charge consumed when receiving bursts of data from a previously calculated estimate of remaining battery power.

3. The method according to claim 2, said method further comprising the step of estimating a total charge consumed when transmitting data from the electronic device.

4. The method according to claim 3, said method further comprising the step of subtracting the estimated total charge consumed when transmitting data from a value resulting from the step of subtracting the estimated total charge consumed when receiving bursts of data from the previously calculated estimate.

5. The method according to claim 2, wherein said estimating step further comprises the steps of:

incrementing at least one counter each time a burst of data is received;

reading at least one value from a memory, the at least one value representing a charge consumed during reception of a burst;

reading a value from the at least one counter, the value representing a number of bursts received since a calculation of a previous battery power estimate; and multiplying the value read from the at least one counter with the at least one value read from the memory to produce said estimated total charge.

6. The method according to claim 5, wherein said step of reading at least one value from a memory further comprises the steps of:

reading a value representing charge consumed during reception of a normal burst; and reading a value representing charge consumed during reception of an RXLEV burst.

7. The method according to claim 6, wherein said step of reading a value from at least one counter further comprises the steps of:

reading a first value from a normal burst counter, the first value representing a number of normal bursts received since a previous battery power estimate was calculated; and reading a second value from an RXLEV burst counter, the second value representing a number of RXLEV bursts received since a previous battery power estimate was calculated.

8. The method according to claim 7, wherein said multiplying step further comprises the steps of:

multiplying the first value with the value representing charge consumed during reception of a normal burst;

multiplying the second value with the value representing charge consumed during reception of an RXLEV burst; and adding the results of the multiplying steps for each type of burst.

9. The method according to claim 5, wherein said step of incrementing comprises:

incrementing a particular counter a first number of times each time a first type of data burst is received; and incrementing the particular counter a second number of times each time a second type of data burst is received.

10. An electronic device comprising:

a calculation circuit for estimating a total charge consumed when receiving bursts of data at the electronic device and subtracting the estimated total charge consumed from a previously calculated estimate of remaining battery power;

at least one counter for incrementing each time a burst of data is received; and a memory for storing at least one charge value, the at least one charge value representing a charge consumed during reception of a burst.

11. The electronic device according to claim 10, wherein said calculation circuit is further operable to read said at least one charge value from the memory, the at least one charge value representing a charge consumed during reception of a burst.

12. The electronic device according to claim 11, wherein said calculation circuit is further operable to:

read a count value from the at least one counter, the count value representing a number of bursts received since a previous battery power estimate was calculated; and multiply the count value read from the at least one counter with the at least one charge value read from the memory.

13. The electronic device according to claim 10, wherein said memory stores a plurality of charge values, each said charge value representing a charge consumed during reception of one of a plurality of burst types, and said at least one counter comprising a plurality of counters, each counter corresponding to one of said plurality of burst types.

14. The electronic device according to claim 13, wherein said plurality of burst types include at least two burst types selected from the group consisting of a normal burst, an RXLEV burst, frequency correction burst, and a synchronization burst.

15. The electronic device according to claim 13, wherein said calculation circuit is further operable to:

multiply each said charge value with a count value from the corresponding counter; and add the multiplication results associated with each type of burst to generate an estimate of a total charge consumed.

* * * * *